(12) United States Patent
Farooq et al.

(10) Patent No.: US 11,848,273 B2
(45) Date of Patent: Dec. 19, 2023

(54) BRIDGE CHIP WITH THROUGH VIA

(71) Applicant: International Business Machines Corporation, Armonk, NY (US)

(72) Inventors: Mukta Ghate Farooq, Hopewell Junction, NY (US); James J. Kelly, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 142 days.

(21) Appl. No.: 17/528,910

(22) Filed: Nov. 17, 2021

(65) Prior Publication Data

US 2023/0154854 A1    May 18, 2023

(51) Int. Cl.
| | | |
|---|---|---|
| H01L 23/538 | (2006.01) | |
| H01L 21/48 | (2006.01) | |
| H01L 25/065 | (2023.01) | |
| H01L 25/10 | (2006.01) | |
| H01L 23/48 | (2006.01) | |

(52) U.S. Cl.
CPC ...... *H01L 23/5381* (2013.01); *H01L 21/4846* (2013.01); *H01L 23/5386* (2013.01); *H01L 25/0655* (2013.01); *H01L 25/105* (2013.01); *H01L 23/481* (2013.01); *H01L 2225/1041* (2013.01)

(58) Field of Classification Search
CPC ............. H01L 23/5381; H01L 21/4846; H01L 23/5386
See application file for complete search history.

(56) References Cited

U.S. PATENT DOCUMENTS

| | | | |
|---|---|---|---|
| 8,158,515 B2 | 4/2012 | Farooq et al. | |
| 8,791,009 B2 | 7/2014 | Farooq et al. | |
| 9,368,450 B1 | 6/2016 | Gu et al. | |
| 9,754,890 B2 | 9/2017 | Deshpande et al. | |
| 9,997,446 B2 | 6/2018 | Kim et al. | |

(Continued)

FOREIGN PATENT DOCUMENTS

| | | |
|---|---|---|
| EP | 4152367 A2 | 3/2023 |
| WO | WO2017111957 A1 | 6/2017 |
| WO | WO2020005392 A1 | 1/2020 |

OTHER PUBLICATIONS

Arnita Podpod et al., "A Novel Fan-Out Concept for Ultra-High Chip-to-Chip Interconnect Density with 20-μm Pitch," 68th Electronic Components and Technology Conference (ECTC), May/Jun. 2018, pp. 370-378.

(Continued)

*Primary Examiner* — Errol V Fernandes
(74) *Attorney, Agent, or Firm* — Daniel Morris; Michael J. Chang, LLC (57) ABSTRACT

Techniques for interconnecting chips using a bridge chip having through vias is provided. In one aspect, a structure includes: a bridge chip attached to at least a first chip and a second chip, wherein the bridge chip has at least one conductive through via connecting the bridge chip to one of the first chip and the second chip. The bridge chip can include a wiring layer having metal lines present between a first capping layer and a second capping layer, and the at least one conductive through via can directly contact at least a sidewall of at least one of the metal lines. A method of integrating chips using the present bridge chip is also provided.

20 Claims, 9 Drawing Sheets

(56) References Cited

U.S. PATENT DOCUMENTS

| | | |
|---|---|---|
| 10,319,629 B1 | 6/2019 | Yang et al. |
| 2008/0150154 A1 | 6/2008 | Hedler et al. |
| 2010/0052178 A1* | 3/2010 | Meinhold ......... H01L 23/53223 |
| | | 257/773 |
| 2016/0133571 A1* | 5/2016 | Lee ........................ H01L 24/19 |
| | | 257/774 |
| 2016/0379929 A1 | 12/2016 | Feurprier et al. |
| 2019/0027431 A1 | 1/2019 | Feng et al. |
| 2019/0164806 A1 | 5/2019 | Leobandung |
| 2019/0206791 A1 | 7/2019 | Pietambaram et al. |
| 2020/0219816 A1 | 7/2020 | Aleksov et al. |
| 2020/0312767 A1 | 10/2020 | Pietambaram et al. |
| 2020/0395313 A1 | 12/2020 | Mallik et al. |
| 2022/0013461 A1* | 1/2022 | Lin ........................ H01L 25/50 |
| 2023/0038892 A1 | 2/2023 | Chen et al. |
| 2023/0085411 A1 | 3/2023 | Paital et al. |

OTHER PUBLICATIONS

John H. Lau, "Heterogeneous Integrations on Silicon Substrates (Bridges)," In Heterogeneous Integrations, Springer, Singapore, 2019, pp. 113-139.

International Search Report and Written Opinion for PCT/EP2022/081847 dated Jul. 6, 2023 (24 pages).

* cited by examiner

BRIDGE CHIP WITH THROUGH VIA

FIELD OF THE INVENTION

The present invention relates to chip interconnection technology, and more particularly, to techniques for interconnecting chips using a bridge chip having through vias that eliminate external connections between the chips.

BACKGROUND OF THE INVENTION

In heterogeneous integration for artificial intelligence workloads, it is important for inter-chip communication to occur at high bandwidths. In some configurations, this inter-chip communication has to occur while chips are connected to a laminate package.

In order to enable chips to communicate with each other with relatively low power losses while attached to a laminate package, a bridge chip can be used to connect the chips. Solder or other suitable types of interconnections (such as an adhesive) can then be employed to attach the bridge chip to the laminate package.

There are, however, some notable challenges associated with the integration of a bridge chip into a chip layout design. For instance, some designs have the bridge chip recessed in the laminate package. In that case, a specialized recess-bearing laminate is needed. This entails a customized laminate that may be difficult and costly to fabricate with good production yields due to the need to precisely locate a recess (or possibly multiple recesses) of tightly-controlled depths in certain areas of the laminate.

Further, conventional approaches for integrating a bridge chip into a chip layout design can require external solder connections that have a mixed pitch, and thus are difficult to scale to smaller chip dimensions. The implementation of copper (Cu)-to-Cu chip connections rather than a conventional solder joining can offer the potential for tighter pitches. However, Cu-to-Cu chip connections are difficult to implement in practice due to Cu/dielectric planarity requirements and the challenges associated with obtaining a contaminant-free Cu-to-Cu interface for bonding.

Therefore, improved techniques for the integration of a bridge chip into a chip layout design would be desirable.

SUMMARY OF THE INVENTION

The present invention provides techniques for interconnecting chips using a bridge chip having through vias that eliminate external connections between the chips. In one aspect of the invention, a structure is provided. The structure includes: a bridge chip attached to at least a first chip and a second chip, wherein the bridge chip has at least one conductive through via connecting the bridge chip to one of the first chip and the second chip. For instance, a sidewall along a top portion of the at least one conductive through via can be joined by a step to a sidewall along a bottom portion of the at least one conductive through via, such that the top portion of the at least one conductive through via has a width $W1_{CONDUCTIVE\ VIA}$ and the bottom portion of the at least one conductive through via has a width $W2_{CONDUCTIVE\ VIA}$, and wherein $W1_{CONDUCTIVE\ VIA} > W2_{CONDUCTIVE\ VIA}$.

In another aspect of the invention, another structure is provided. The structure includes: a bridge chip attached to at least a first chip and a second chip, wherein the bridge chip has at least one conductive through via connecting the bridge chip to one of the first chip and the second chip, and a wiring layer having metal lines present between a first capping layer and a second capping layer, and wherein the at least one conductive through via directly contacts at least a sidewall of at least one of the metal lines. For instance, the at least one conductive through via can directly contact a top surface, and a sidewall of at least one of the metal lines. Alternatively, the at least one conductive through via can directly contact only a sidewall of at least one of the metal lines.

In yet another aspect of the invention, a method of integrating chips is provided. The method includes: forming a bridge chip having at least one via present in a substrate, a first capping layer disposed on the substrate, a wiring layer having metal lines disposed on the first capping layer, and a second capping layer disposed on the wiring layer, wherein the at least one via is filled with a sacrificial material; placing the bridge chip over at least a first chip and a second chip; removing the sacrificial material from the at least one via; extending the at least one via through the first capping layer, the wiring layer and the second capping layer down to the first chip and the second chip; and filling the at least one via with at least one metal to form at least one conductive through via, wherein the at least one conductive through via directly contacts at least a sidewall of at least one of the metal lines, and wherein the at least one conductive through via connects the bridge chip to one of the first chip and the second chip.

A more complete understanding of the present invention, as well as further features and advantages of the present invention, will be obtained by reference to the following detailed description and drawings.

DETAILED DESCRIPTION OF PREFERRED EMBODIMENTS

As described above, conventional chip integration techniques commonly employ solder or copper (Cu)-to-Cu interface connections between chips. However, there are notable drawbacks associated with each of these approaches. For instance, solder connections have fundamentally poor parasitics, severe pitch limitations, and can fail due to thermal stresses. Proper Cu-to-Cu bonding needs an oxide-free Cu-to-Cu interface, thus adding the constraint of performing the bonding in a reducing atmosphere.

Provided herein are techniques for interconnecting chips using a bridge chip that has through vias formed therein. Advantageously, placing through vias in the bridge chip eliminates the need for external connections such as solder or Cu-to-Cu interface connections between the chips. In terms of scalability, a tighter pitch can be realized with the present techniques as compared to solder connections or even Cu-to-Cu interface connections. Also, the through via transmissions supported by the present bridge chip designs provide back-end-of-line (BEOL)-type high quality connectivity between chips with a very high bandwidth.

Figure 1:
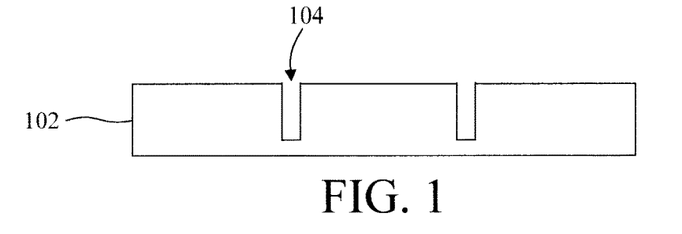
FIG. 1 is a cross-sectional diagram illustrating vias having been patterned in a substrate according to an embodiment of the present invention.
Figure 2:
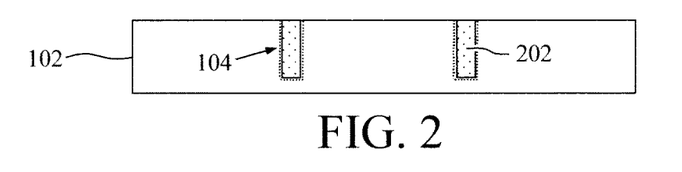
FIG. 2 is a cross-sectional diagram illustrating the vias having been filled with a sacrificial material according to an embodiment of the present invention.

An exemplary methodology for forming the present bridge chip having through vias is now described by way of reference to FIGS. 1-5. As shown in FIG. 1, the process for forming the bridge chip begins with the patterning of at least two vias 104 in a substrate 102. According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, substrate 102 may already have pre-built structures (not shown) such as transistors, diodes, capacitors, resistors, interconnects, wiring, etc.

Standard lithography and etching techniques can be employed to pattern the vias 104 in the substrate 102. With standard lithography and etching techniques, a lithographic stack (not shown), e.g., photoresist/anti-reflective coating (ARC)/organic planarizing layer (OPL), is used to pattern a hardmask (not shown) with the footprint and location of the features to be patterned (in this case the vias 104). Alternatively, the hardmask can be formed by other suitable techniques, including but not limited to, sidewall image transfer (SIT), self-aligned double patterning (SADP), self-aligned quadruple patterning (SAQP), and other self-aligned multiple patterning (SAMP). An etch is then used to transfer the pattern from the hardmask to the underlying substrate 102 to form the vias 104. A directional (anisotropic) etching process such as reactive ion etching (RIE) can be employed for the via etch. Suitable hardmask materials include, but are not limited to, nitride hardmask materials such as silicon nitride (SiN), silicon oxynitride (SiON) and/or silicon carbide nitride (SiCN), and/or oxide hardmask materials such as SiOx.

As shown in FIG. 1, the as-patterned vias 104 extend only partway through the substrate 102. Later on in the process, the vias 104 will be opened on the other side of the substrate 102 to form through vias (i.e., vias extending through the substrate 102 from one side to another). According to an exemplary embodiment, each of the vias 104 has a diameter of from about 1 micrometer (μm) to about 10 μm and ranges therebetween, and an aspect ratio (height-to-diameter) of from about 5 to about 10 and ranges therebetween. It is notable that the depiction of two vias 104 in the figures is merely an example being used to illustrate the present techniques. Embodiments are contemplated herein where more (or fewer) vias 104 than shown are formed in the substrate 102. Following patterning of the vias 104, an oxide liner (not shown) of a nominal thickness of from about 0.1 micrometers (μm) to about 1 μm and ranges therebetween can be deposited into and lining the vias 104 using sub-atmospheric chemical vapor deposition (SACVD), plasma enhanced chemical vapor deposition (PECVD)/chemical vapor deposition (CVD) or atomic layer deposition (ALD) processes to insulate the substrate 102 electrically from the vias 104. This oxide liner can be annealed to improve its quality (e.g., at a temperature of from about 800 degrees Celsius (° C.) to about 1100° C. and ranges therebetween using a steam anneal or some other environment favorable for good quality oxides) and resistance to wet and dry etching.

The vias 104 are then filled with a sacrificial material 202. See FIG. 2. The term 'sacrificial' as used herein refers to a structure that is removed, in whole or in part, during the fabrication process. Suitable sacrificial materials include, but are not limited to, dielectric materials such as silicon oxide (SiOx) and/or silicon nitride (SiN), which can be deposited using a process such as CVD, ALD, physical vapor deposition (PVD) or a casting process such as spin-coating or spray casting. Following deposition, an optional reliability anneal can be performed. The sacrificial material 202 is then polished down to the surface of the substrate 102 using a process such as chemical-mechanical polishing (CMP). Dotted lines are now being used to depict the outlines of the vias 104 (that are now filled with the sacrificial material 202).

A capping layer 302 is then formed on the substrate 102 over the vias 104/sacrificial material 202. See FIG. 3. Suitable materials for the capping layer 302 include, but are not limited to, nitride materials such as SiN, silicon oxynitride (SiON) and/or silicon oxycarbonitride (SiOCN), which can be deposited using a process such as CVD, ALD or PVD. According to an exemplary embodiment, capping layer 302 has a thickness of from about 2 nanometers (nm) to about 500 nm and ranges therebetween.

Figure 3:
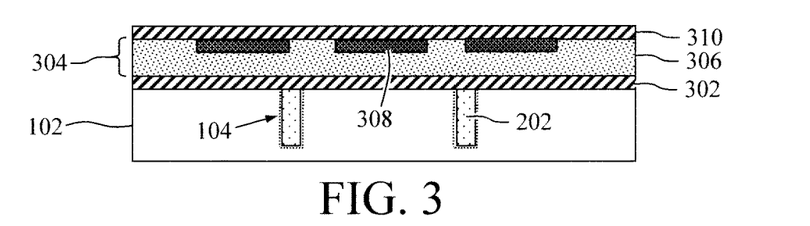
FIG. 3 is a cross-sectional diagram illustrating a (first) capping layer having been formed on the substrate over the vias/sacrificial material, a wiring layer with metal lines having been formed on the first capping layer, and a (second) capping layer having been formed on the wiring layer over the metal lines according to an embodiment of the present invention.

A back-end-of-line (BEOL) wiring layer 304 is then formed on the capping layer 302. According to an exemplary embodiment, wiring layer 304 is formed by first depositing an interlayer dielectric (ILD) 306 onto the capping layer 302. Suitable ILD 306 materials include, but are not limited to, oxide materials such as SiOx and/or organosilicate glass (SiCOH) and/or ultralow-κ interlayer dielectric (ULK-ILD) materials, e.g., having a dielectric constant κ of less than 2.7.

Suitable ultralow-κ dielectric materials include, but are not limited to, porous organosilicate glass (pSiCOH). A process such as CVD, ALD, or PVD can be used to deposit the ILD 306. Following deposition, the ILD 306 can be polished using a process such as CMP.

Standard lithography and etching techniques (see above) are then employed to pattern features such as vias and/or trenches in the ILD 306, which are then filled with a metal (or combination of metals) to form metal lines 308 in the ILD 306. Suitable metals include, but are not limited to, copper (Cu), tungsten (W), ruthenium (Ru), cobalt (Co), nickel (Ni) and/or platinum (Pt), which can be deposited into the features using a process such as evaporation, sputtering, or electrochemical plating. Following deposition, the metal overburden can be removed using a process such as CMP. Prior to depositing the metal(s) into the features, a conformal barrier layer (not shown) can be deposited into and lining the features. Use of such a barrier layer helps to prevent diffusion of the metal(s) into the surrounding dielectric. Suitable barrier layer materials include, but are not limited to, ruthenium (Ru), tantalum (Ta), tantalum nitride (TaN), titanium (Ti), and/or titanium nitride (TiN). Additionally, a seed layer (not shown) can be deposited into and lining the features prior to metal deposition. A seed layer facilitates plating of the metal into the features.

Next, a capping layer 310 is formed on the wiring layer 304 over the metal lines 308. For clarity, the terms 'first' and 'second' may also be used herein when referring to capping layer 302 and capping layer 310, respectively. Suitable materials for the capping layer 310 include, but are not limited to, nitride materials such as SiN, SiON and/or SiOCN, which can be deposited using a process such as CVD, ALD or PVD. According to an exemplary embodiment, capping layer 310 has a thickness of from about 2 nm to about 500 nm and ranges therebetween.

As provided above, the as-patterned vias 104 extend only partway through the substrate 102. However, a handle wafer 402 is next attached to a side of the capping layer 310 opposite the wiring layer 304, and the vias 104 are opened on the other side of the substrate 102 to form through vias. See FIG. 4. By way of example only, the handle wafer 402 can be attached to the capping layer 310 using an adhesive, dielectric bonding and/or any other standard wafer bonding technique known in the art. According to an exemplary embodiment, a temporary adhesive is used to attach handle wafer 402 to the capping layer 310. That way, the handle wafer can be easily removed following completion of the bridge chip structure (see below). By way of example only, suitable temporary adhesives are commercially-available from Brewer Science, Inc., Rolla, MO and from the 3M Company, St. Paul, MN Optionally, the adhesive used is a light-releasable adhesive such as ultraviolet (UV) tape. Suitable light-releasable adhesives are commercially available, for example, from Furukawa Electric Co., LTD., Tokyo, Japan.

Figure 4:
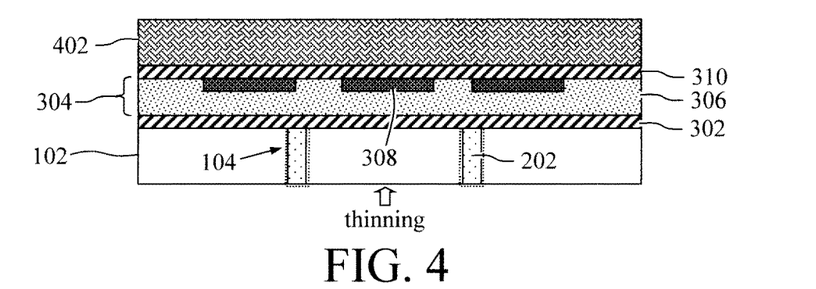
FIG. 4 is a cross-sectional diagram illustrating a handle wafer having been attached to a side of the second capping layer opposite the wiring layer, and the vias having been opened on the other side of the substrate to form a bridge chip according to an embodiment of the present invention.

With the handle wafer 402 in place to secure the structure, a backside thinning of the substrate 102 is performed to expose the vias 104/sacrificial material 202 at a backside of the substrate 102 (i.e., a side of the substrate 102 opposite the handle wafer 402. A process such as CMP or grinding can be used to thin the substrate 102.

A bridge chip 501 (i.e., substrate 102 having (through) vias 104/capping layer 302/wiring layer 304/capping layer 310) has now been formed. While it is still mounted to the handle wafer 402, the bridge chip is then flipped over, and a block mask 502 is formed on the substrate 102 marking the openings of the (through) vias 104. See FIG. 5. By 'flipped over' it is meant that the components at the bottom of the bridge chip structure are now at the top, and vice versa.

Figure 5:
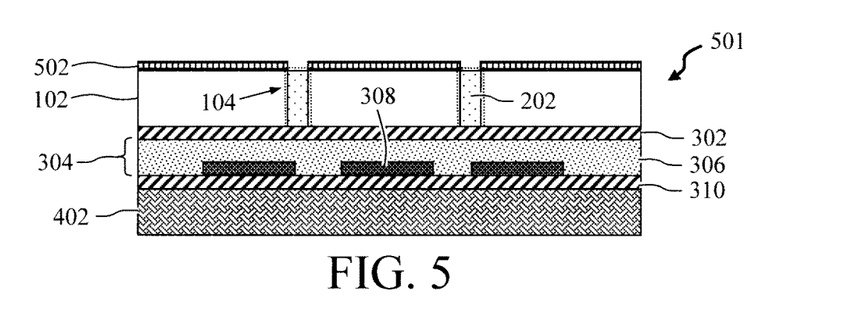
FIG. 5 is a cross-sectional diagram illustrating the bridge chip having been flipped over, and a block mask having been formed on the substrate marking the openings of the vias according to an embodiment of the present invention.

As will be described in detail below, the bridge chip will be used to interconnect at least two chips. During that process, the sacrificial material 202 will be removed and replaced with a metal(s) to form conductive through vias in the bridge chip. Block mask 502 will facilitate selective removal of the sacrificial material 202 and deposition of the metal(s) into the (through) vias 104. Suitable materials for the block mask 502 include, but are not limited to, nitride materials such as SiN, SiON and/or SiCN, which can be deposited using a process such as CVD, ALD or PVD. According to an exemplary embodiment, the block mask 502 has a thickness of from about 2 nm to about 500 nm and ranges therebetween. Standard lithography and etching techniques (see above) can be employed to pattern the block mask 502. Following deposition and patterning of the block mask 502, the bridge chip can be de-bonded from the handle wafer 402.

While the present example focuses on the formation of a given bridge chip, it would be apparent to one skilled in the art that the above-described process can be implemented in the same manner described in the fabrication of a plurality of bridge chips on a common substrate. Following deposition and patterning of the block mask 502, standard wafer dicing procedures can then be employed to divide the substrate into individual bridge chips for use and placement where needed.

Figure 6:
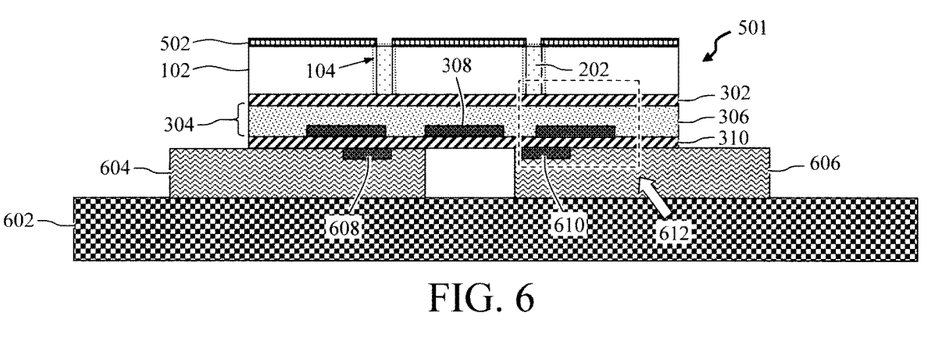
FIG. 6 is a cross-sectional diagram illustrating (first/second) chips with metal pads present on a fixture, and the bridge chip having been placed over and across the first/second chips according to an embodiment of the present invention.

The bridge chip is then used to interconnect at least two different chips. An exemplary methodology for chip integration using the present bridge chip design is now described by way of reference to FIG. 6-16. As shown in FIG. 6, chips 604 and 606 are present on a fixture 602, and the bridge chip 501 is placed over and across the chips 604 and 606. Specifically, bridge chip 501 is bonded to a side of the chips 604 and 606 opposite the fixture 602. More specifically, the capping layer 310 of bridge chip 501 is bonded to at least a portion of the top surface of each of the chips 604 and 606. By way of example only, bridge chip 501 can be bonded to the chips 604 and 606 using an adhesive, dielectric bonding or bonding layers. These wafer bonding techniques are known to those in the art, and thus are not described further herein.

Fixture 602 generally represents any type of substrate on which chips 604 and 606 can be arranged. For instance, according to an exemplary embodiment, fixture 602 is a glass plate or silicon wafer that is attached to chips 604 and 606 using a temporary adhesive (see above) to enable de-bonding of the fixture 602 once the chips 604 and 606 have been attached to the bridge chip. Advantageously, a glass plate or silicon wafer is transparent to light. In that case, a light-releasable adhesive can be employed to attach chips 604 and 606 to the fixture 602 for easy de-bonding using laser radiation, ultraviolet (UV) radiation, optical radiation and/or infrared (IR) radiation administered through the (transparent) fixture 602. According to an exemplary embodiment, chips 604 and 606 are logic and/or memory chips. While chips 604 and 606 are shown in this example as having similar dimensions, embodiments are contemplated herein where the fixture is configured to accommodate chips of varying heights.

Figure 7:
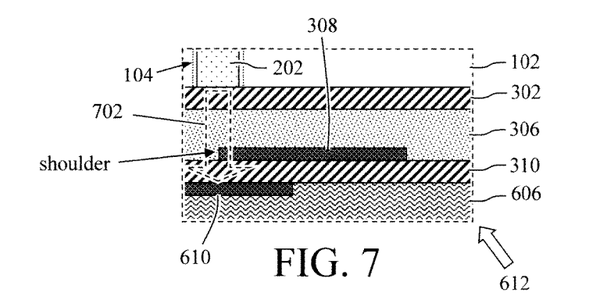
FIG. 7 is a magnified view illustrating how the metal pads are located directly beneath the vias according to an embodiment of the present invention.
Figure 8:
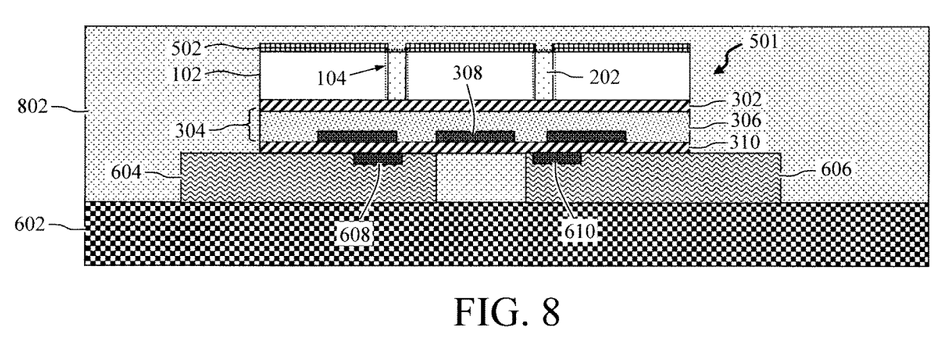
FIG. 8 is a cross-sectional diagram illustrating an encapsulant having been deposited onto the fixture over, and burying, the bridge chip and the first/second chips according to an embodiment of the present invention.

As shown in FIG. 6, chips 604 and 606 each have a metal pad 608 and 610, respectively, at the top surface thereof. Standard metallization techniques can be employed to form the metal pads 608 and 610 in chips 604 and 606. Notably, at least a portion of these metal pads 608 and 610 is located directly beneath one of the vias 104. Further, a portion or 'shoulder' of the metal lines 308 is located in the path between the metal pads 608/610 and the respective vias 104. To help illustrate this concept, a magnified view of area 612 is provided in FIG. 7. As shown in FIG. 7, metal pad 610 is located directly beneath one of the vias 104. Thus, when the sacrificial material 202 is later removed and an etch is used to extend the vias 104 through capping layer 302/ILD 306/capping layer 310, the etch will land fully on the metal pad 610. While not visible in the magnified view, the same arrangement applies to metal pad 608. Further, an arrow 702 is being used in FIG. 7 to indicate the path between metal pad 610 and the respective via 104. With this configuration, a portion of one of the metal lines 308 is present in the path between the metal pad 610 and via 104. In this particular case, a portion of the top surface/bottom surface and a sidewall (collectively referred to herein as a 'shoulder') of the metal lines 308 is present in the path between the metal pad 610 and via 104. Again, the same arrangement applies to metal pad 608. That way, the conductive through via formed later on in the process between the via 104 and the metal pad 610 will also contact a 'shoulder' of the metal lines 308. It is notable that other configurations are also contemplated herein. For instance, in an alternative embodiment described in detail below, a 'skim-by' configuration is instead employed where contact is made only to the sidewall (rather than the full 'shoulder') of the metal lines 308.

Figure 9:
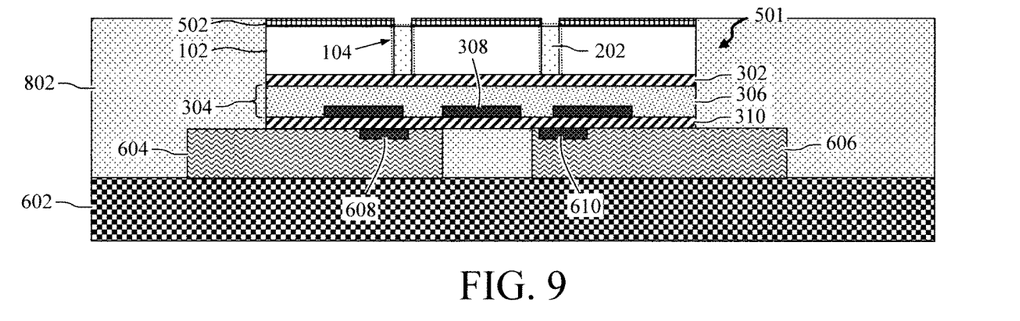
FIG. 9 is a cross-sectional diagram illustrating the as-deposited encapsulant having been planarized and cleared from the block mask over the vias according to an embodiment of the present invention.
Figure 10:
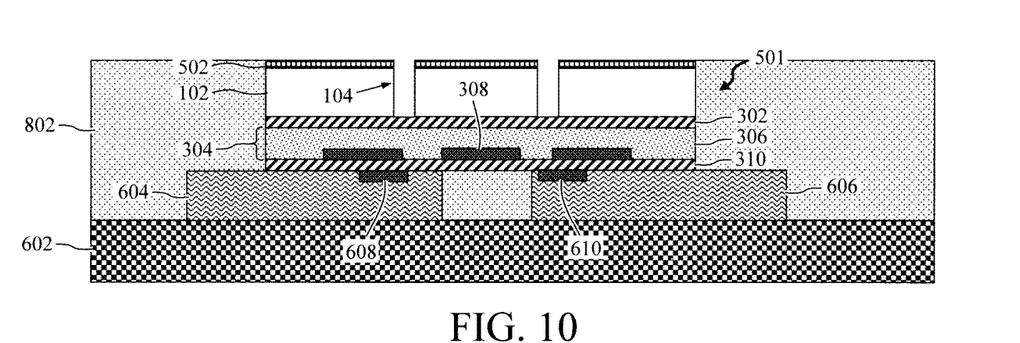
FIG. 10 is a cross-sectional diagram illustrating the sacrificial material having been selectively removed thereby re-opening the vias according to an embodiment of the present invention.

An encapsulant 802 is then deposited onto the fixture 602 over, and burying, the bridge chip 501/chips 604 and 606. See FIG. 8. Suitable encapsulant materials include, but are not limited to, cyanate esters. The as-deposited encapsulant 802 is then planarized using a process such as CMP. See FIG. 9. Block mask 502 serves as an etch stop for this planarization process. As shown in FIG. 9, the encapsulant 802 is cleared from the block mask 502 over the vias 104. The amount of encapsulant 802 remaining after planarization is minimal and can easily be removed using a suitable wet or dry etching process with little, if any, effect on the bulk of the encapsulant 802 to the left and right of the bridge chip 501.

As described above, block mask 502 leaves the sacrificial material 202 within the vias 104 exposed. The sacrificial material 202 is then selectively removed re-opening the vias 104. See FIG. 10. According to an exemplary embodiment, the sacrificial material 202 is selectively removed using a non-directional (i.e., isotropic) etching process such as a wet chemical etch or gas phase etch.

Figure 11:
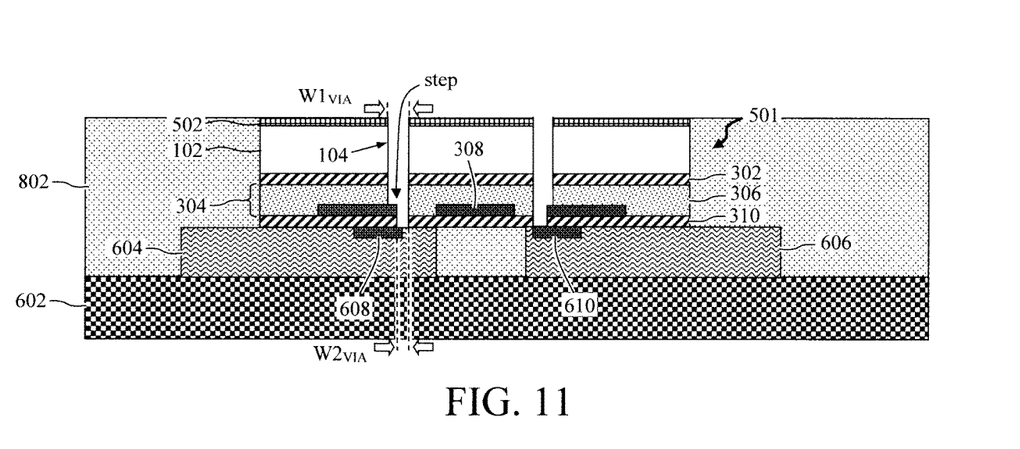
FIG. 11 is a cross-sectional diagram illustrating an etch having been performed to extend the vias through the first/second capping layers and the wiring layer, down to the metal pads according to an embodiment of the present invention.

An etch is then performed to extend the vias 104 through the capping layer 302, ILD 306 and capping layer 310, down to the metal pads 608 and 610. See FIG. 11. In this particular example, the 'shoulder' of the metal lines 308 is present in the path between vias 104 and the metal pads 608 and 610. Extending the vias 104 around this 'shoulder' of the metal lines 308 results in the vias 104 having a stepped sidewall over the 'shoulder' and different top and bottom widths. Namely, as shown in FIG. 11, one sidewall of the vias 104 (i.e., the sidewall opposite the 'shoulder') is continuous and straight, while the opposite sidewall along a top portion of the vias 104 (i.e., above the metal lines 308) is joined by a step to the sidewall along a bottom portion of the vias 104 (i.e., below the metal lines 308). Based on this configuration, the top portion of the vias 104 have a width $W1_{VIA}$, and the bottom portion of the vias 104 have a width $W2_{VIA}$, where $W1_{VIA}$ is greater than $W2_{VIA}$, i.e., $W1_{VIA} > W2_{VIA}$. Following the via extension etch, an additional deposited oxide liner (not shown) is applied within the vias 104 to insulate them from the surrounding BEOL structures that have been revealed during the via extension etch. Processes such as SACVD, PECVD/CVD or ALD may be used to deposit this additional oxide liner to a thickness of from about 0.1 μm to about 1 μm and ranges therebetween.

The vias 104 are then filled with a metal or combination of metals to form conductive through vias 1202. See FIG. 12. However, prior to filling the vias 104 with the metal(s), a collimated dry etch is performed to remove any oxide from the tops of the metal structures in the BEOL layers of the bridge chip 501 as well as the chips 604 and 606 to be connected by the bridge chip 501. A reaction ion etch using argon (Ar) ions for example can be used. This etch leaves the top surface of the metal structures clean of any oxide and ready to be connected during the subsequent metallization process. Suitable metals for the conductive through vias 1202 include, but are not limited to, copper (Cu), tungsten (W), ruthenium (Ru), cobalt (Co), nickel (Ni) and/or platinum (Pt), which can be deposited into the vias 104 using a process such as evaporation, sputtering, or electrochemical plating. Following deposition, the metal overburden can be removed using a process such as CMP. After the collimated dry etch is performed, but prior to depositing the metal(s) into the vias 104, a conformal barrier layer (not shown) can be deposited into and lining the vias 104. Use of such a barrier layer helps to prevent diffusion of the metal(s) into the surrounding dielectric. Suitable barrier layer materials include, but are not limited to, ruthenium (Ru), tantalum (Ta), tantalum nitride (TaN), titanium (Ti), and/or titanium nitride (TiN). Additionally, a seed layer (not shown) can be deposited into and lining the vias 104 prior to metal deposition. A seed layer facilitates plating of the metal into the vias 104.

Figure 12:
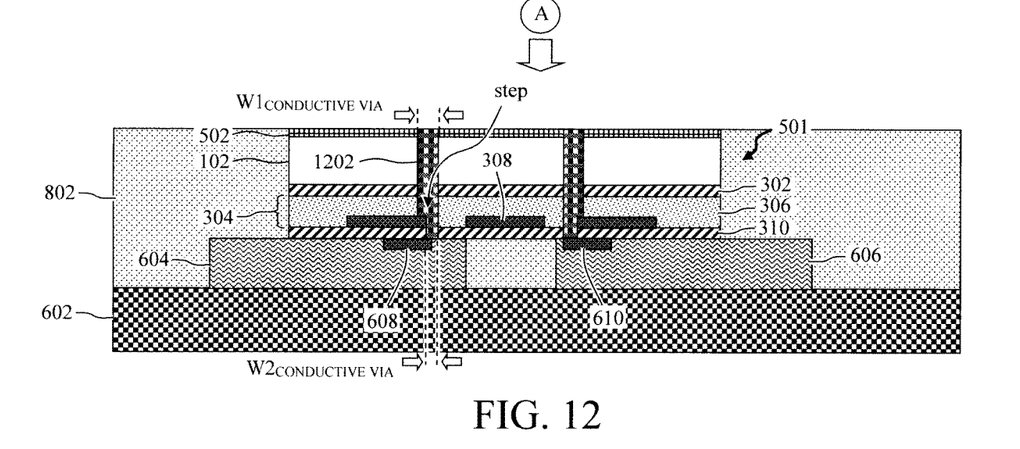
FIG. 12 is a cross-sectional diagram illustrating the vias having been filled with a metal or combination of metals to form conductive through vias that directly contact the metal pads in the first/second chips, as well as a top surface and sidewall (i.e., shoulder) of the metal lines according to an embodiment of the present invention.

As shown in FIG. 12, the conductive through vias 1202 directly contact the metal pads 608/610 in chips 604/606, as well as a top surface and sidewall (also referred to herein as the 'shoulder') of the metal lines 308. As a result of this configuration, the conductive through vias 1202 have a stepped sidewall over the 'shoulder' and different top and bottom widths. Namely, one sidewall of the conductive through vias 1202 (i.e., the sidewall opposite the 'shoulder') is continuous and straight, while the opposite sidewall along a top portion of the conductive through vias 1202 (i.e., above the metal lines 308) is joined by a step to the sidewall along a bottom portion of the conductive through vias 1202 (i.e., below the metal lines 308). Based on this configuration, the top portion of the conductive through vias 1202 have a width $W1_{CONDUCTIVE\ VIA}$, and the bottom portion of the conductive through vias 1202 have a width $W2_{CONDUCTIVE\ VIA}$, where $W1_{CONDUCTIVE\ VIA}$ is greater than $W2_{CONDUCTIVE\ VIA}$, i.e., $W1_{CONDUCTIVE\ VIA} > W2_{CONDUCTIVE\ VIA}$.

As also shown in FIG. 12, each of the conductive through vias 1202 connects the bridge chip 501 to one of the chips 604 and 606. For instance, the conductive through vias 1202 shown on the left in FIG. 12 contacts both the metal lines 308 and the metal pad 608 thereby connecting the bridge chip 501 to the chip 604. Similarly, the conductive through vias 1202 shown on the right in FIG. 12 contacts both the metal lines 308 and the metal pad 610 thereby connecting the bridge chip 501 to the chip 606. It is notable that, while the present example employs a pair of conductive through vias 1202, this is merely an exemplary, non-limiting example, and it is to be understood that more (or fewer) conductive through vias 1202 can be employed than shown. For instance, embodiments are contemplated herein where the bridge chip 501 employs only a single conductive through via 1202.

Figure 13A:
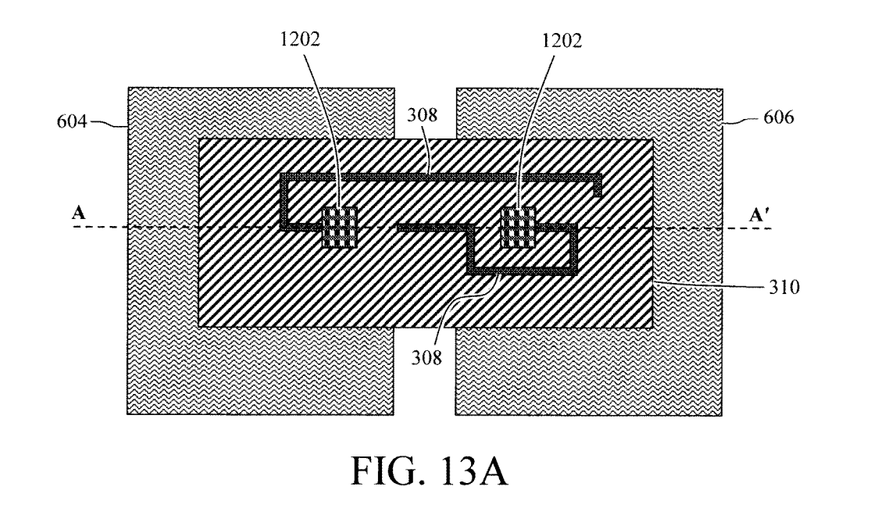
FIG. 13A is a top-down diagram illustrating an exemplary arrangement of the conductive through vias relative to the metal lines where the conductive through vias are aligned next to one another according to an embodiment of the present invention.
Figure 13B:
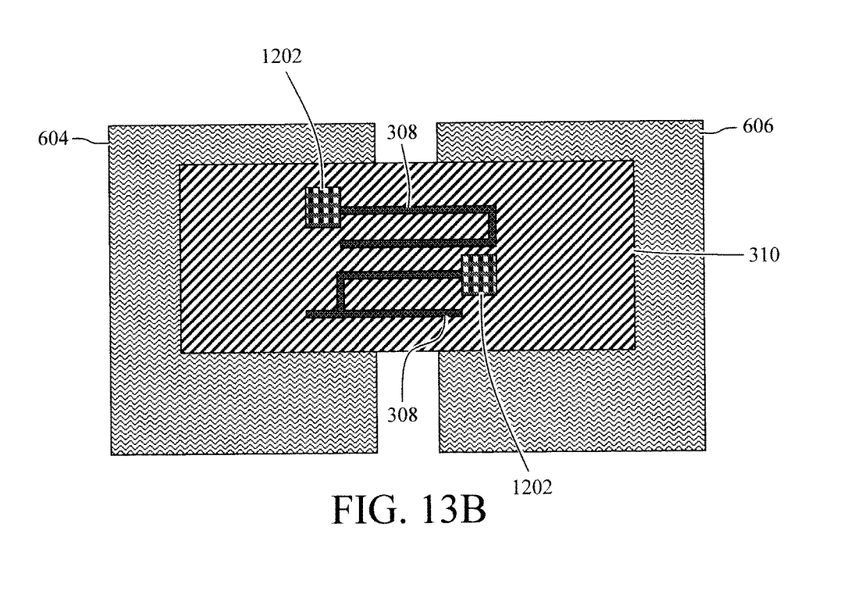
FIG. 13B is a top-down diagram illustrating, according to an alternative embodiment, an arrangement of the conductive through vias relative to the metal lines where the conductive through vias are offset from one another according to an embodiment of the present invention.

FIG. 13A is a top-down view (e.g., from viewpoint A—see FIG. 12) an exemplary arrangement of the conductive through vias 1202 relative to the metal lines 308. For instance, FIG. 12 (and the preceding figures) illustrate cross-sectional cuts through the top-down view along line A-A'. For ease and clarity of depiction, the layers present over the metal lines 308 have been omitted from the top-down view. It is notable that the exact routing of the metal lines 308 shown is arbitrary. What is important is that the conductive through vias 1202 serve to interconnect the metal pads 608 and 610 of chips 604 and 606, respectively, to the metal lines 308. It is further notable that the placement of the conductive through vias 1202 can also be varied. For instance, rather than being aligned next to one another (as in FIG. 13A), the conductive through vias 1202 can instead be offset from one another, and the placement of the metal lines 308 adjusted accordingly. See, for example, the alternative embodiment shown illustrated in FIG. 13B (also a top-down view).

Figure 14:
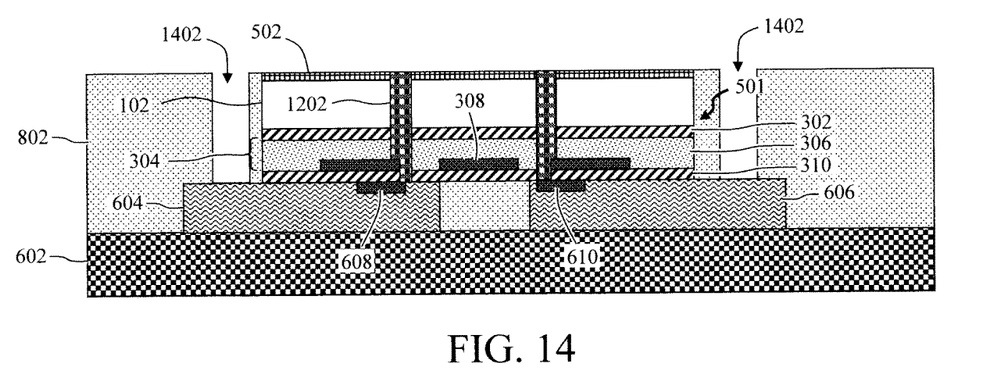
FIG. 14 is a cross-sectional diagram illustrating through mold vias having been patterned in the encapsulant over the first/second chips according to an embodiment of the present invention.

Optionally, standard lithography and etching techniques (see above) are then used to pattern through mold vias 1402 in the encapsulant 802 over the chips 604 and 606. See FIG. 14. As shown in FIG. 14, the through mold vias 1402 are positioned to the left and right of the bridge chip 501, and extend through the encapsulant 802 down to the chips 604 and 606. As will be described in detail below, the through mold vias 1402 will be used to form connections between the chips 604/606 and a laminate package.

The through mold vias 1402 are then filled with a metal(s) to form conductive mold vias 1502 that directly contact the chips 604/606 to either side of the bridge chip 501. See FIG. 15. Suitable metals include, but are not limited to, Cu, W, Ru, Co, Ni and/or Pt, which can be deposited into the through mold vias 1402 using a process such as evaporation, sputtering, or electrochemical plating. Following deposition, the metal overburden can be removed using a process such as CMP. Prior to depositing the metal(s) into the through mold vias 1402, a conformal barrier layer (not shown) can be deposited into and lining the through mold vias 1402. As provided above, use of such a barrier layer helps to prevent diffusion of the metal(s) into the surrounding dielectric. Suitable barrier layer materials include, but are not limited to, Ru, Ta, TaN, Ti, and/or TiN. Additionally, a seed layer (not shown) can be deposited into and lining the through mold vias 1402 prior to metal deposition. A seed layer facilitates plating of the metal into the through mold vias 1402.

Figure 15:
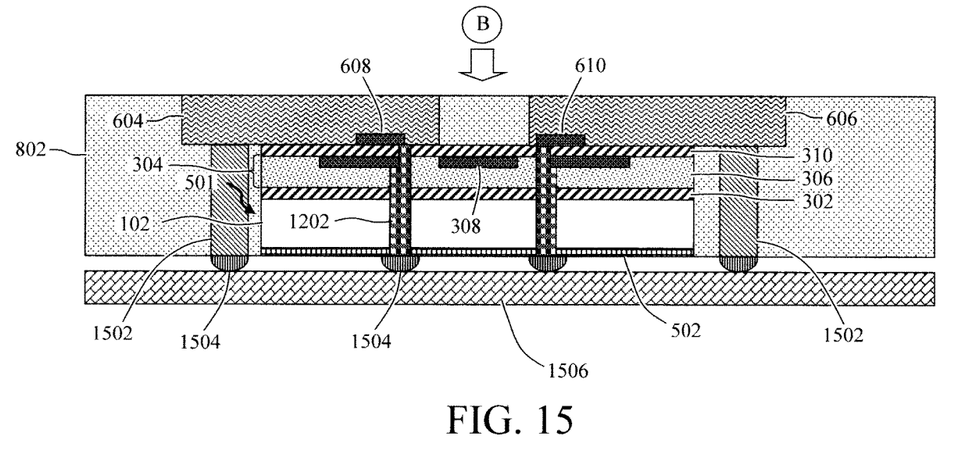
FIG. 15 is a cross-sectional diagram illustrating through mold vias having been filled with a metal(s) to form conductive mold vias that directly contact the first/second chips to either side of the bridge chip, the assembly having been flipped over, solder bonds having been formed between the conductive through vias/the conductive mold vias and a laminate package, and the fixture having been removed according to an embodiment of the present invention.

As shown in FIG. 15, the conductive mold vias 1502 can then be used to mount the bridge chip 501/chips 604/606 assembly to a laminate package 1506. Namely, bridge chip 501/chips 604/606 assembly can be flipped over so that the chips 604/606 are on top and the bridge chip 501 is on the bottom. Solder bonds 1504 are then formed between the conductive through vias 1202/the conductive mold vias 1502 and the laminate package 1506. According to an exemplary embodiment, the solder bonds include tin (Sn), silver (Ag), Cu, and/or alloys thereof such as tin-silver (SnAg) solder and/or tin-silver-copper (SnAgCu) solder.

Figure 16:
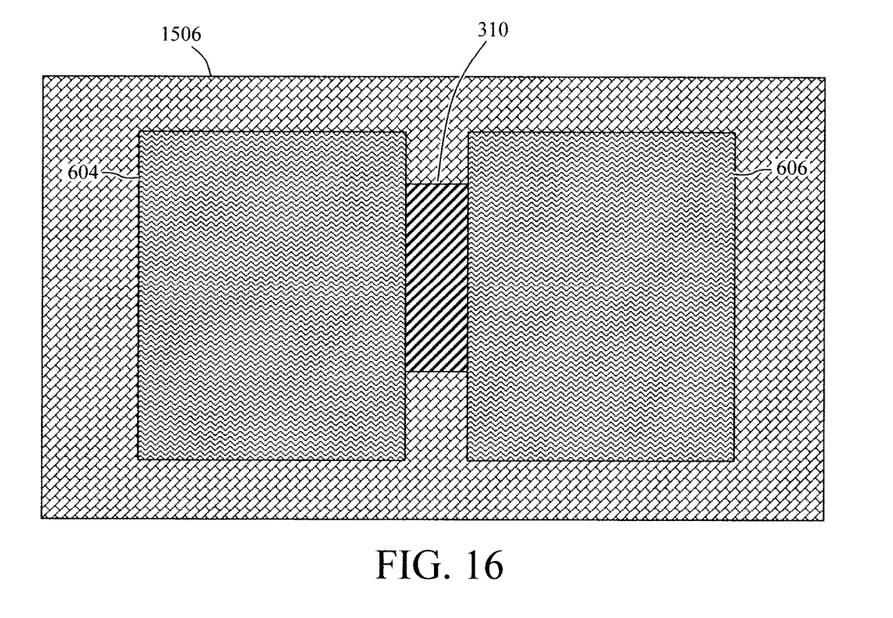
FIG. 16 is a top-down diagram illustrating the final assembly according to an embodiment of the present invention.

The fixture 602 can then be removed. For instance, as described above, the fixture can be attached to the chips 604 and 606 using a temporary adhesive such as a light-releasable adhesive. In that case, a fixture 602 can be employed that is transparent to light, which will enable debonding of the fixture 602 from the chips 604 and 606 using laser radiation, ultraviolet (UV) radiation, optical radiation and/or infrared (IR) radiation administered through the (transparent) fixture 602. FIG. 16 is a top-down view (e.g., from viewpoint B—see FIG. 15) of the final assembly. For ease and clarity of depiction, the encapsulant 802 has been omitted from the top-down view.

Figure 17:
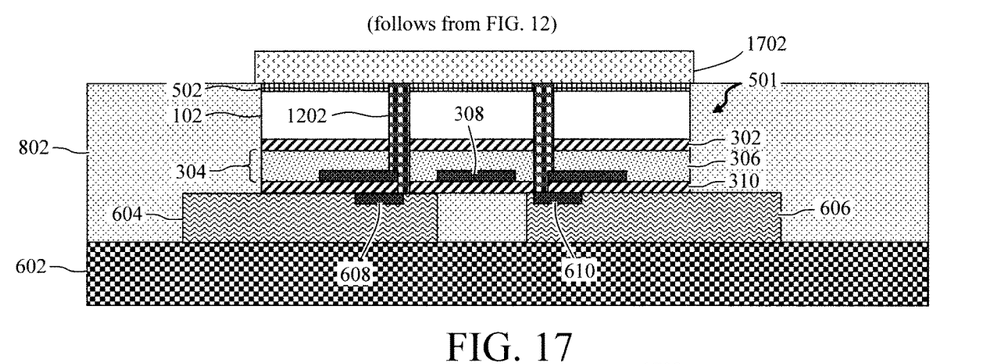
FIG. 17 is a cross-sectional diagram which follows from FIG. 12 illustrating, according to another alternative embodiment, a (third) chip having been attached to the bridge chip over the block mask and in direct contact with an end of the conductive through vias opposite the metal pads according to an embodiment of the present invention.

Embodiments are also contemplated herein where at least one additional (e.g., logic and/or memory) chip 1702 is integrated into the assembly. See FIG. 17. For clarity, the terms 'first,' 'second' and 'third' may also be used herein when referring to chips 604, 606 and 1702, respectively. In this exemplary embodiment, the integration process flow proceeds in the same manner as above with a bridge chip 501 fabricated as described in conjunction with the description of FIG. 1-5, above, which is then placed over/across chips 604 and 606 (mounted to fixture 602), and the conductive through vias 1202 formed directly contacting the chips 604 and 606 and at least a sidewall of the metal lines 308, as described in conjunction with the description of FIGS. 6-12, above. Thus, what is depicted in FIG. 17 follows from the assembly shown in FIG. 12. Like structures are numbered alike in the figures. Here, however, chip 1702 is next attached to the bridge chip 501 over the block mask 502 and in direct contact with an end of the conductive through vias 1202 opposite the metal pads 608/610. See FIG. 17. By way of example only, chip 1702 can be attached to the bridge chip 501 using an adhesive, dielectric bonding and/or any other standard wafer bonding technique known in the art.

Figure 18:
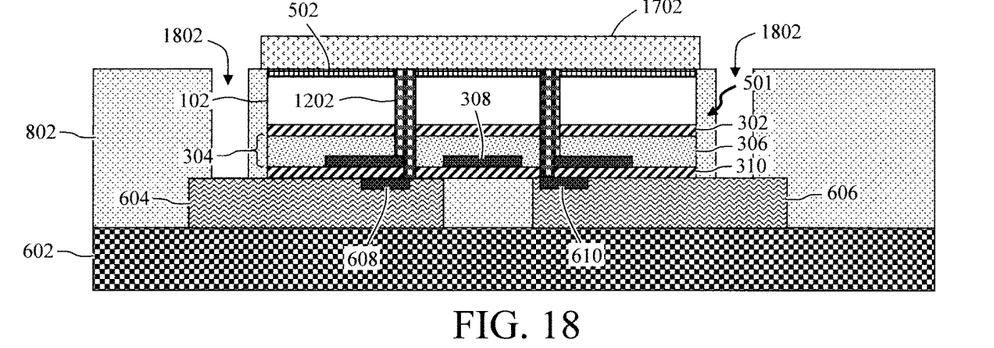
FIG. 18 is a cross-sectional diagram illustrating through mold vias having been patterned in the encapsulant over the first/second chips according to an embodiment of the present invention.

In the same manner as described above, standard lithography and etching techniques are then used to pattern through mold vias 1802 in the encapsulant 802 over the chips 604 and 606. See FIG. 18. As shown in FIG. 18, chip 1702 is directly over the bridge chip 501, and the through mold vias 1802 are positioned to the left and right of the bridge chip 501/chip 1702. The through mold vias 1802 extend through the encapsulant 802 down to the chips 604 and 606. As will be described in detail below, the through mold vias 1402 will be used to form connections between the chips 604/606 and a laminate package.

The through mold vias 1802 are then filled with a metal(s) to form conductive mold vias 1902 that directly contact the chips 604/606 to either side of the bridge chip 501/chip 1702. See FIG. 19. Suitable metals include, but are not limited to, Cu, W, Ru, Co, Ni and/or Pt, which can be deposited into the through mold vias 1802 using a process such as evaporation, sputtering, or electrochemical plating. Following deposition, the metal overburden can be removed using a process such as CMP. Prior to depositing the metal(s) into the through mold vias 1802, a conformal barrier layer (not shown) can be deposited into and lining the through mold vias 1902. As provided above, use of such a barrier layer helps to prevent diffusion of the metal(s) into the surrounding dielectric. Suitable barrier layer materials include, but are not limited to, Ru, Ta, TaN, Ti, and/or TiN. Additionally, a seed layer (not shown) can be deposited into and lining the through mold vias 1802 prior to metal deposition. A seed layer facilitates plating of the metal into the through mold vias 1802.

Figure 19:
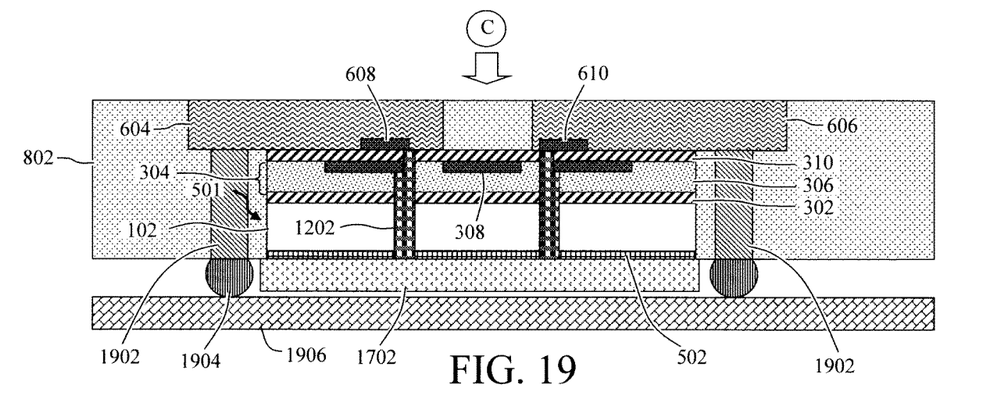
FIG. 19 is a cross-sectional diagram illustrating the through mold vias having been filled with a metal(s) to form conductive mold vias that directly contact the first/second chips to either side of the bridge chip/third chip, the assembly having been flipped over, solder bonds having been formed between the conductive mold vias and a laminate package, and the fixture having been removed according to an embodiment of the present invention.

As shown in FIG. 19, the conductive mold vias 1902 can then be used to mount the bridge chip 501/chips 604/606/1702 assembly to a laminate package 1906. Namely, bridge chip 501/chips 604/606/1702 assembly can be flipped over so that the chips 604/606 are on top and the bridge chip 501/1702 is on the bottom. Solder bonds 1904 are then formed between the conductive mold vias 1902 and the laminate package 1906. According to an exemplary embodiment, the solder bonds include Sn, Ag, Cu, and/or alloys thereof such as SnAg solder and/or SnAgCu solder.

Figure 20:
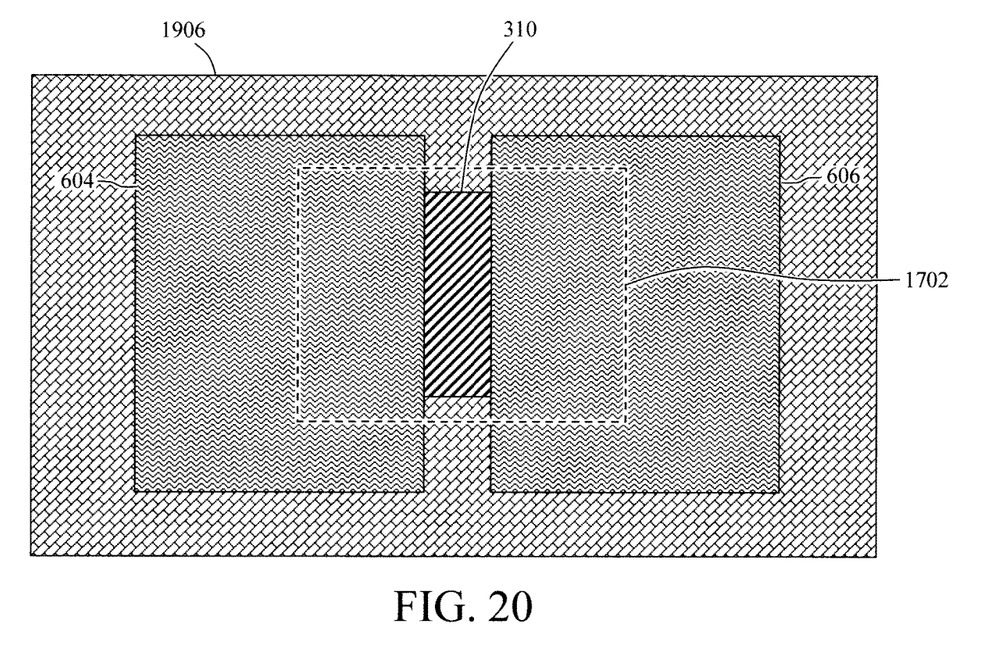
FIG. 20 is a top-down diagram illustrating the final assembly according to an embodiment of the present invention.

The fixture 602 can then be removed. For instance, as described above, the fixture 602 can be attached to the chips 604 and 606 using a temporary adhesive such as a light-releasable adhesive. In that case, a fixture 602 can be employed that is transparent to light, which will enable debonding of the fixture 602 from the chips 604 and 606 using laser radiation, UV radiation, optical radiation and/or IR radiation administered through the (transparent) fixture 602. FIG. 20 is a top-down view (e.g., from viewpoint C—see FIG. 19) of the final assembly. For ease and clarity of depiction, the encapsulant 802 has been omitted from the top-down view. Dashed lines are used to depict the positioning of chip 1702.

In the above examples, the conductive through vias 1202 contact a 'shoulder' (i.e., a top surface and sidewall) of the metal lines 308. However, a proper connection can be made as long as the conductive through vias 1202 contact at least a sidewall of the metal lines 308. For instance, according to an alternative embodiment, the metal lines are positioned such that the conductive through vias contact only a sidewall of the metal lines. See FIG. 21. This configuration is also referred to herein as a 'skim-by' connection since the conductive through vias skim the sidewall surface of the metal lines. For clarity, the metal lines and conductive through vias in this alternative embodiment are given the reference numeral 308' and 1202'. As noted above, like structures are numbered alike in the figures. In this case, a selective oxide liner deposition process as described above is used to apply the additional oxide material (not shown) to the BEOL layers of the bridge chip 501 so as to allow an electrical connection between the metal lines 308' in the bridge chip 501 and the conductive through vias 1202'.

Figure 21:
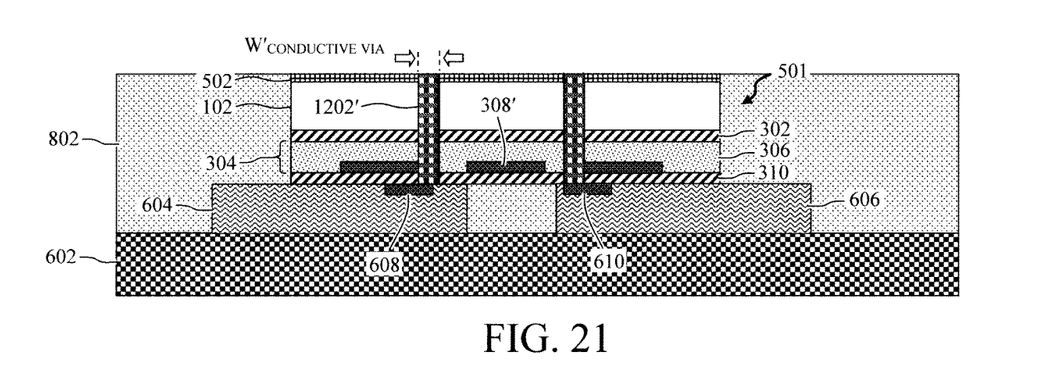
FIG. 21 is a cross-sectional diagram illustrating, according to yet another alternative embodiment, conductive through vias that directly contact the metal pads in the first/second chips, as well as only a sidewall of the metal lines (i.e., a skim-by connection) according to an embodiment of the present invention.

As shown in FIG. 21, conductive through vias 1202' directly contact the metal pads 608/610 in the chips 604/606. However, the metal lines 308' are positioned such that the conductive through vias 1202' contact only a sidewall of the metal lines 308'. Advantageously, with a 'skim-by' connection the width of the conductive through vias 1202' is not reduced below the metal lines 308'. Namely, as shown in FIG. 21, the conductive through vias 1202' have a uniform width $W'_{CONDUCTIVE\ VIA}$ and straight vertical sidewalls. By comparison, in the previous example (see, e.g., FIG. 12), the presence of the 'shoulder' of the metal lines 308 in the path between the vias 104 and the metal pads 608/610 caused a reduction in the width (i.e., $W2_{CONDUCTIVE\ VIA}$) of the conductive through vias 1202 below the metal lines 308, and produces a step along the sidewall. While the contact area of the conductive through vias 1202' with the metal lines 308' is reduced in the 'skim-by' connection, the uniform width of the conductive through vias 1202' reduces the overall resistance of the interconnections.

Figure 22:
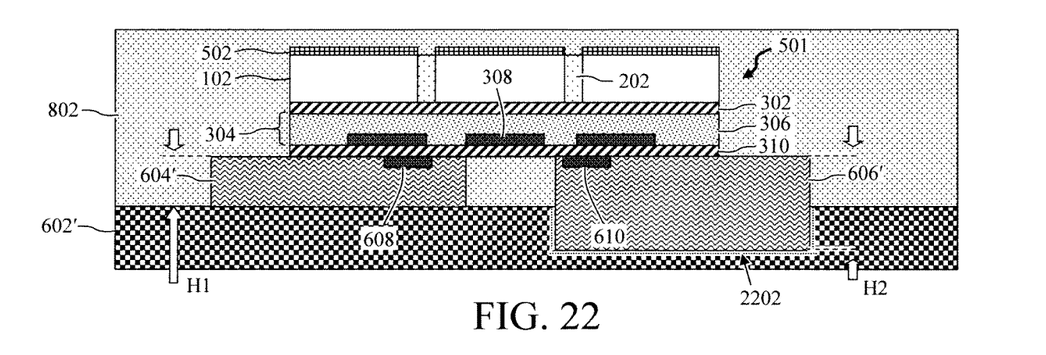
FIG. 22 is a cross-sectional diagram illustrating, according to still yet another alternative embodiment, a modified fixture having been employed which contains a recess to accommodate chips of varying heights according to an embodiment of the present invention.
Figure 23:
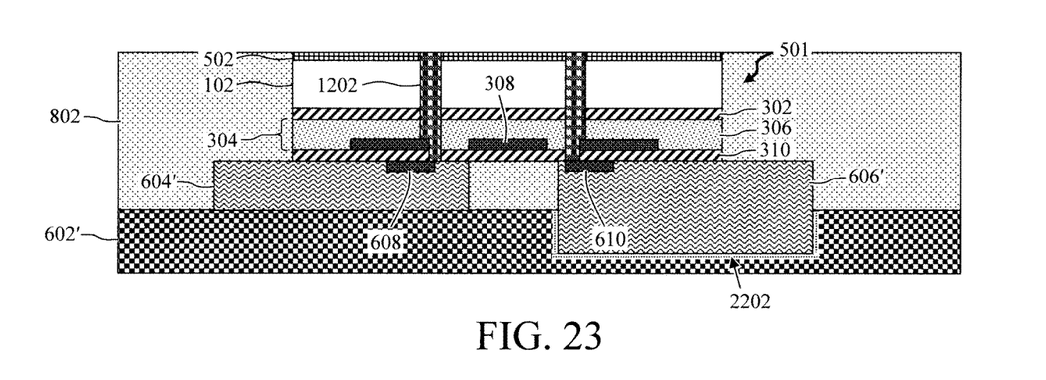
FIG. 23 is a cross-sectional diagram illustrating conductive through vias having been formed in contact with the chips of the varying heights according to an embodiment of the present invention.

In the preceding examples, the chips 604 and 606 are shown as having similar dimensions. However, embodiments are contemplated herein where the present assembly is configured to accommodate chips of differing dimensions such as varying heights. See FIG. 22. As noted above, like structures are numbered alike in the figures. As shown in FIG. 22, chip 604' has a first height H1 and chip 606' has a second height H2, where H2 is greater than H1, i.e., H2>H1. To accommodate for this height discrepancy amongst the chips 604' and 606', a modified fixture 602' is employed which contains a recess 2202 (shown with dotted lines) in which the taller chip 606' sits, thereby placing the surfaces of the chips 604' and 606' to which the bridge chip 501 is attached at a uniform height. The remainder of the process is then the same as described above. For completeness, a depiction of the assembly with the chips 604' and 606' of varying heights following formation of the conductive through vias 1202 is shown in FIG. 23.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A structure, comprising:
a bridge chip attached to at least a first chip and a second chip, wherein the bridge chip comprises at least one conductive through via connecting the bridge chip to one of the first chip and the second chip, wherein the at least one conductive through via extends completely through the bridge chip, and wherein the bridge chip directly contacts both the first chip and the second chip.

2. The structure of claim 1, wherein a sidewall along a top portion of the at least one conductive through via is joined by a step to a sidewall along a bottom portion of the at least one conductive through via.

3. The structure of claim 1, wherein the top portion of the at least one conductive through via has a width $W1_{CONDUCTIVE\ VIA}$ and the bottom portion of the at least one conductive through via has a width $W2_{CONDUCTIVE\ VIA}$, and wherein $W1_{CONDUCTIVE\ VIA} > W2_{CONDUCTIVE\ VIA}$.

4. The structure of claim 1, wherein the bridge chip further comprises:
a wiring layer having metal lines present between a first capping layer and a second capping layer.

5. The structure of claim 4, wherein the at least one conductive through via directly contacts a top surface, and a sidewall of at least one of the metal lines.

6. The structure of claim 4, wherein the at least one conductive through via directly contacts only a sidewall of at least one of the metal lines.

7. The structure of claim 1, wherein the first chip and the second chip comprise metal pads, and wherein the at least one conductive through via directly contacts at least one of the metal pads.

8. The structure of claim 1, wherein the first chip and the second chip have different heights from one another.

9. The structure of claim 1, wherein the first chip and the second chip are selected from the group consisting of: memory chips, logic chips, and combinations thereof.

10. The structure of claim 1, further comprising:
an encapsulant disposed over the bridge chip, the first chip and the second chip.

11. The structure of claim 10, further comprising:
a laminate package; and
conductive through mold vias present in the encapsulant that connect the first chip and the second chip to the laminate package.

12. The structure of claim 1, further comprising:
at least one third chip attached to the bridge chip and in contact with an end of the at least one conductive through via opposite the first chip and the second chip.

13. The structure of claim 12, wherein the at least one third chip is a memory chip or a logic chip.

14. A structure comprising:
a bridge chip attached to at least a first chip and a second chip, wherein the bridge chip comprises at least one conductive through via connecting the bridge chip to one of the first chip and the second chip, and a wiring layer having metal lines present between a first capping layer and a second capping layer, wherein the at least one conductive through via directly contacts at least a sidewall of at least one of the metal lines, wherein the at least one conductive through via extends completely through the bridge chip, and wherein the bridge chip directly contacts both the first chip and the second chip.

15. The structure of claim 14, wherein the at least one conductive through via directly contacts a top surface, and a sidewall of at least one of the metal lines.

16. The structure of claim 14, wherein the at least one conductive through via directly contacts only a sidewall of at least one of the metal lines.

17. The structure of claim 14, further comprising:
an encapsulant disposed over the bridge chip, the first chip and the second chip;
a laminate package; and
conductive through mold vias present in the encapsulant that connect the first chip and the second chip to the laminate package.

18. The structure of claim 14, further comprising:
at least one third chip attached to a side of the bridge chip opposite the first chip and the second chip, wherein the at least one conductive through via is in contact with the at least one third chip.

19. A method of integrating chips, the method comprising:
forming a bridge chip comprising at least one via present in a substrate, a first capping layer disposed on the substrate, a wiring layer having metal lines disposed on the first capping layer, and a second capping layer disposed on the wiring layer, wherein the at least one via is filled with a sacrificial material;
placing the bridge chip over at least a first chip and a second chip;
removing the sacrificial material from the at least one via;
extending the at least one via through the first capping layer, the wiring layer and the second capping layer down to the first chip and the second chip; and
filling the at least one via with at least one metal to form at least one conductive through via, wherein the at least one conductive through via directly contacts at least a sidewall of at least one of the metal lines, and wherein the at least one conductive through via connects the bridge chip to one of the first chip and the second chip.

20. The method of claim 19, further comprising:
attaching at least one third chip to a side of the bridge chip opposite the first chip and the second chip, wherein the at least one conductive through via is in contact with the at least one third chip.

* * * * *